(12) United States Patent
Zandian

(10) Patent No.: US 11,581,355 B2
(45) Date of Patent: Feb. 14, 2023

(54) FULLY RETICULATED DETECTORS FOR CURVED FOCAL PLANE ARRAYS

(71) Applicant: Teledyne Scientific & Imaging, LLC, Thousand Oaks, CA (US)

(72) Inventor: Majid Zandian, Calabasas, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 202 days.

(21) Appl. No.: 17/060,575

(22) Filed: Oct. 1, 2020

(65) Prior Publication Data

US 2021/0118934 A1      Apr. 22, 2021

Related U.S. Application Data

(60) Provisional application No. 62/923,189, filed on Oct. 18, 2019.

(51) Int. Cl.
| | | |
|---|---|---|
| H01L 27/146 | (2006.01) | |
| H01L 33/58 | (2010.01) | |
| H01L 31/0232 | (2014.01) | |

(52) U.S. Cl.
CPC .... *H01L 27/14636* (2013.01); *H01L 27/1462* (2013.01); *H01L 27/1469* (2013.01); *H01L 27/14627* (2013.01); *H01L 27/14634* (2013.01); *H01L 27/14643* (2013.01); *H01L 27/14685* (2013.01); *H01L 27/14694* (2013.01); *H01L 27/14696* (2013.01); *H01L 31/0232* (2013.01);
(Continued)

(58) Field of Classification Search
CPC ......... H01L 27/14627; H01L 27/14685; H01L 27/1462; H01L 27/14636; H01L 31/0232; H01L 31/02327; H01L 33/58
See application file for complete search history.

(56) References Cited

U.S. PATENT DOCUMENTS

| | | | | |
|---|---|---|---|---|
| 5,646,066 A | * | 7/1997 | Frank | H01L 31/022408 |
| | | | | 148/DIG. 135 |
| 10,128,294 B2 | * | 11/2018 | Migita | H01L 27/14636 |
| 10,727,267 B2 | * | 7/2020 | Zhang | H01L 27/1469 |

(Continued)

FOREIGN PATENT DOCUMENTS

| | | |
|---|---|---|
| EP | 3624191 A1 | 3/2020 |
| WO | WO2018/022622 A1 | 2/2018 |

(Continued)

OTHER PUBLICATIONS

Search and Examination Report dated Mar. 9, 2021, Application No. GB2015925.7.

Primary Examiner — David A Zarneke
(74) Attorney, Agent, or Firm — M.J. Ram & Associates

(57) ABSTRACT

A curved FPA comprises an array of detectors, with mesas etched between the detectors such that they are electrically and physically isolated from each other. Metallization deposited at the bottom of the mesas reconnects the detectors electrically and thereby provides a common ground between them. Strain induced by bending the FPA into a curved shape is across the metallization and any backfill epoxy, rather than across the detectors. Indium bumps are evaporated onto respective detectors for connection to a readout integrated circuit (ROIC). An ROIC coupled to the detectors is preferably thinned, and the backside of the ROIC may also include mesas such that the ROIC is reticulated.

14 Claims, 5 Drawing Sheets

(52) U.S. Cl.
CPC ........ *H01L 31/02327* (2013.01); *H01L 33/58* (2013.01)

(56) References Cited

U.S. PATENT DOCUMENTS

| | | | |
|---|---|---|---|
| 10,957,733 B2 * | 3/2021 | Zhang | H01L 27/1469 |
| 11,094,736 B1 * | 8/2021 | Nosho | H01L 31/035236 |
| 2010/0224950 A1 | 9/2010 | Dinyari et al. | |

FOREIGN PATENT DOCUMENTS

| | | | | |
|---|---|---|---|---|
| WO | WO-2018022622 A1 * | 2/2018 | ........ | H01L 27/1443 |
| WO | WO2018/156877 A1 | 8/2018 | | |

* cited by examiner

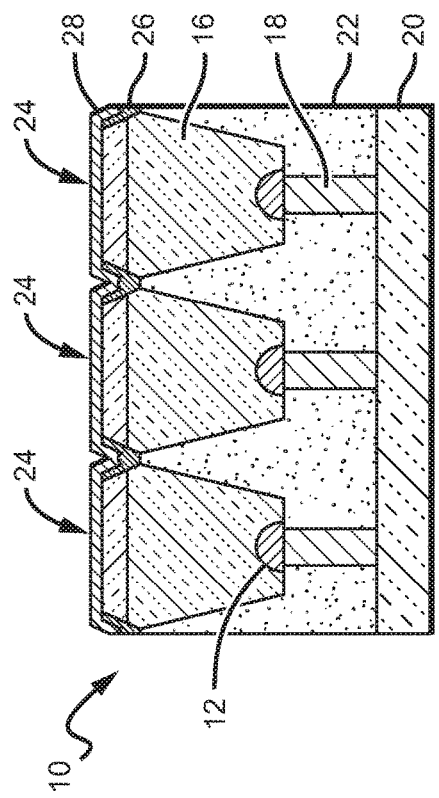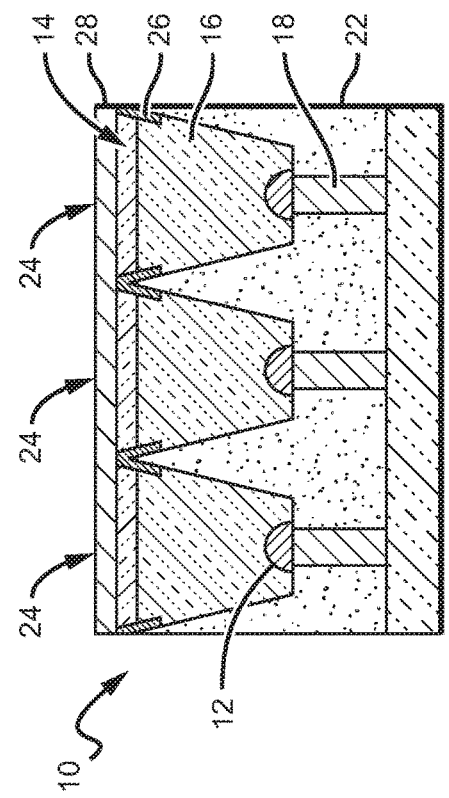
FIG. 1A
FIG. 2B
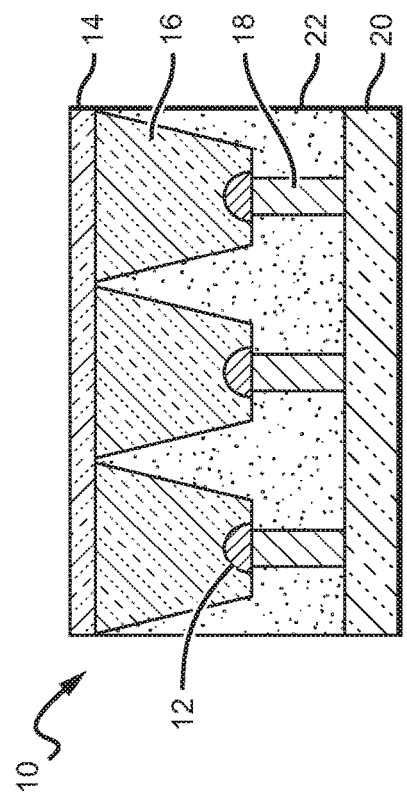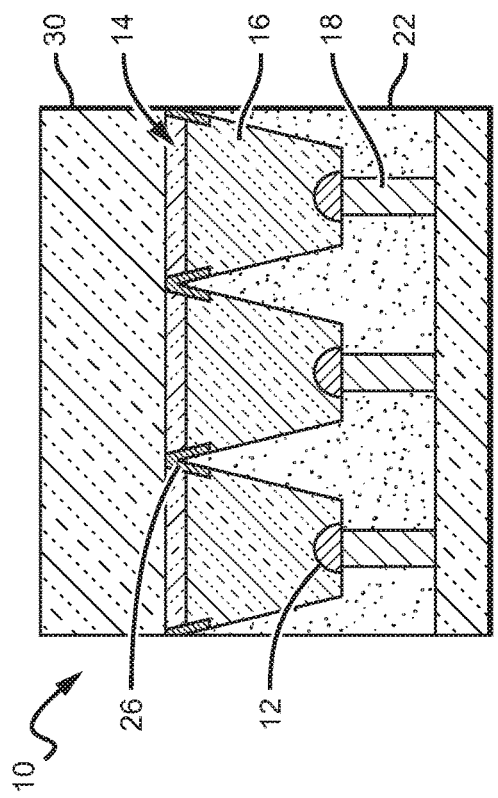
FIG. 1B
FIG. 2A

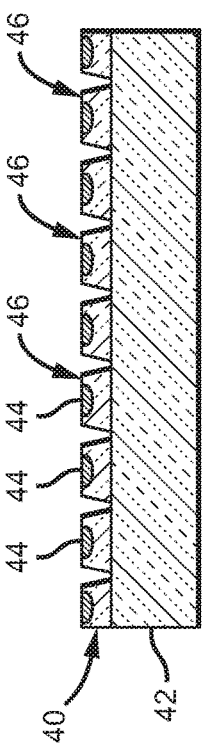
FIG. 3A
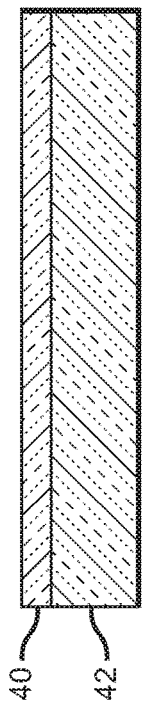
FIG. 3B
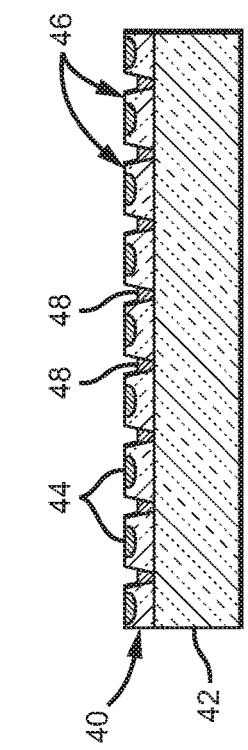
FIG. 3C
FIG. 3D
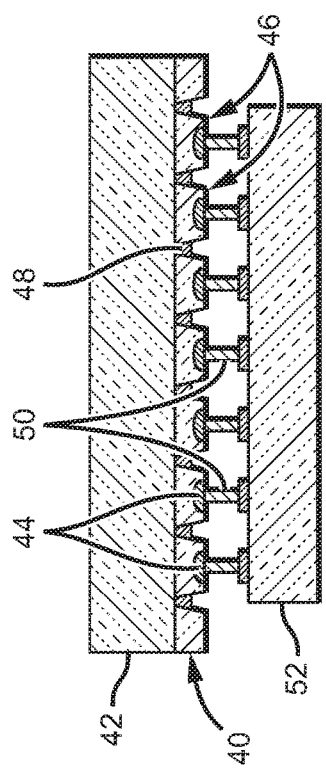
FIG. 3E
FIG. 3F
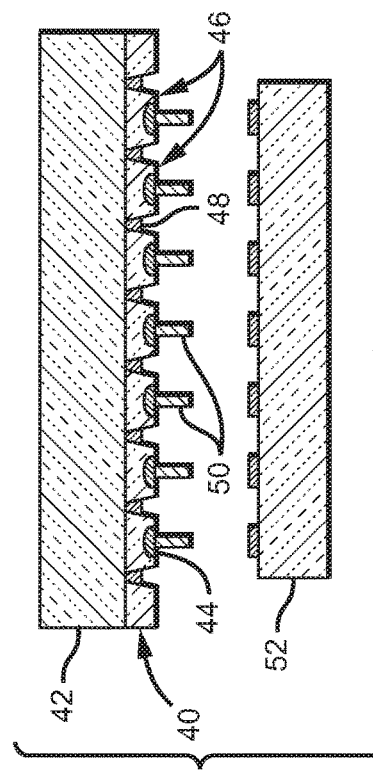
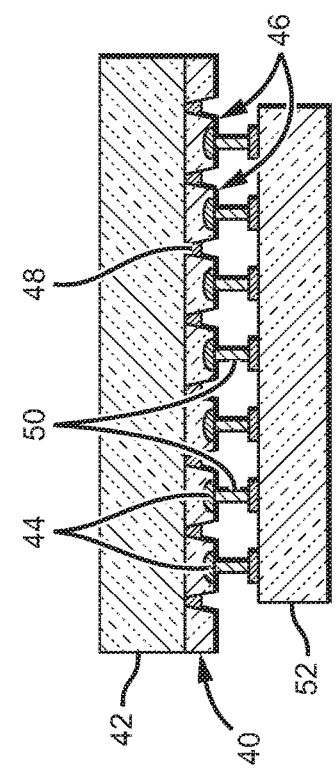

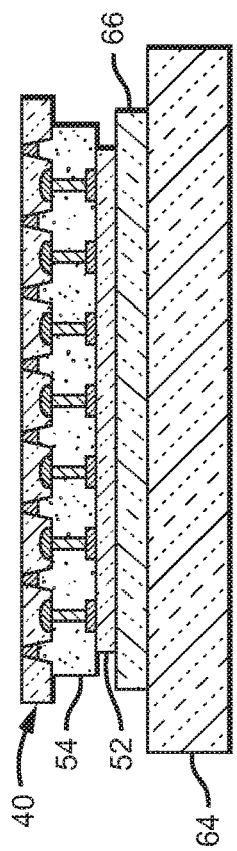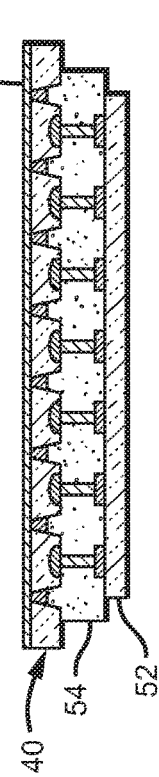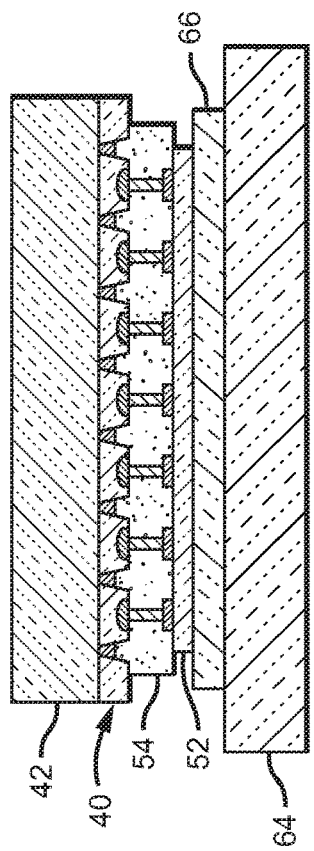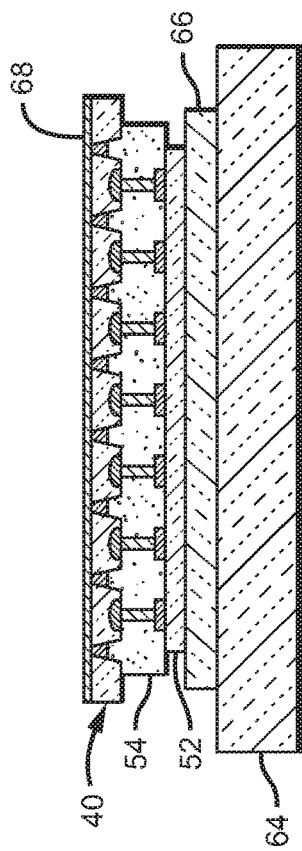

FULLY RETICULATED DETECTORS FOR CURVED FOCAL PLANE ARRAYS

RELATED APPLICATIONS

This application claims the benefit of provisional patent application No. 62/923,189 to Majid Zandian, filed Oct. 18, 2019.

BACKGROUND OF THE INVENTION

Field of the Invention

This invention relates generally to focal plane arrays (FPAs), and more particularly to structures and methods for fabricating curved FPAs.

Description of the Related Art

It is difficult to bring light to focus on all areas of a flat planar surface such as a conventional FPA. It is much easier to bring light to focus, especially over a large field of view, onto a spherical surface. Thus, it would make optics easier and the optics would provide better performance if the FPA could be a spherical surface. A curved image surface also provides a way to lower the number of optical elements, reduce aberrations including astigmatism and coma, and increase off-axis brightness and sharpness.

But it is difficult to provide a curved FPA. One approach is to simply bend the FPA into a curved shape; however, the curvature can induce strain in the detectors making up the array, which can degrade their performance and/or damage the array.

SUMMARY OF THE INVENTION

Presented herein is an FPA formed from an array of fully reticulated detectors. This enables the fabrication of a curved FPA by reducing strain induced to the detectors due to FPA bending.

The present curved FPA comprises an array of detectors, with mesas etched between the detectors such that they are electrically and physically isolated from each other. Metallization deposited at the bottom of the mesas reconnects the detectors electrically and thereby provides a common ground between the detectors. When so arranged, strain induced by bending the FPA into a curved shape is across the metallization and any backfill epoxy, rather than across the detectors. The array of detectors is preferably fabricated with a common light-sensitive base layer and a common buffer layer, with the mesas etched through the base and buffer layers.

Indium bumps would typically be evaporated onto respective detectors for connection to a readout integrated circuit (ROIC). An ROIC coupled to the detector is preferably thinned, and the backside of the ROIC may also include mesas such that the ROIC is reticulated.

These and other features, aspects, and advantages of the present invention will become better understood with reference to the following drawings, description, and claims.

BRIEF DESCRIPTION OF THE DRAWINGS

FIG. 1A is a sectional view of an FPA prior to reticulation.
FIG. 1B is a sectional view of an FPA after reticulation per the present invention.
FIG. 2A is a sectional view of an FPA prior to reticulation.
FIG. 2B is a sectional view of an FPA after reticulation per the present invention.

DETAILED DESCRIPTION OF THE INVENTION

Figure 3G:
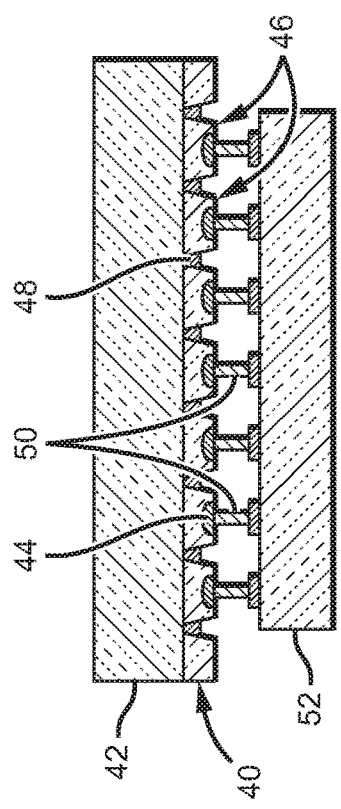
FIGS. 3A-3R are sectional views of process steps as might be used to fabricate a curved FPA per the present invention.

A curved focal plane array (FPA) in accordance with the present invention comprises an array of detectors, mesas etched between the detectors such that they are electrically and physically isolated from each other, and metallization at the bottom of the mesas to reconnect the detectors electrically and thereby provide a common ground between the detectors.

The basic structure is illustrated in FIGS. 1A and 1B. FIG. 1A depicts an FPA prior to the etching of mesas. The FPA structure 10 comprises three detectors 12 in this exemplary embodiment, preferably made from a common buffer layer 14 fabricated on a substrate (removed in FIG. 1A), and a common light-sensitive base layer 16 on the buffer layer on which p-n junctions 12 have been formed.

A typical FPA would also comprise indium bumps 18 evaporated onto respective detectors 12, for connection to a readout integrated circuit (ROIC), and an ROIC 20 coupled to the detectors. Epoxy backfill 22 would typically be wicked into the area between the detectors and ROIC, and cured.

In accordance with the present invention, as shown in FIG. 1B, mesas 24 are etched between the detectors such that they are electrically and physically isolated from each other. Metallization 26 provided at the bottom of the mesas reconnects the detectors electrically and thereby provides a common ground between the detectors. By so doing, if the FPA is bent such that it is curved, the resulting strain is across metallization 26 and backfill epoxy 22.

Fabrication of a structure as described above would typically be performed with a substrate in place. Once the epoxy has been cured, the substrate would typically be removed. Once the substrate is removed, an anti-reflective (AR) coating 28 may be applied to the FPA's backside. A coating thickness of 3000-5000 Å is preferred.

The backside ROIC 20 is preferably thinned, making the hybridized structure more flexible. Mesas (not shown) may also be formed on the ROIC's backside such that ROIC 20 is reticulated, thereby making the ROIC even more flexible. The present bendable FPA can be bent into a semi-circle; if the ROIC is sufficiently thinned—down to, for example, 25 microns or less—the FPA may be bent to form a full circle, or a spherical surface.

With a conventional FPA, once the pixels are connected to an ROIC through indium bumps, the entire array of detectors has to match in expansion and contraction to the ROIC. If there is a thermal coefficient mismatch between the detector array and the ROIC, stress is placed on the detectors which may cause damage upon cooling or heating. In contrast, for the present FPA, by reticulating the pixels as described above, the pixels can expand and contract as much as needed without being stressed, which serves to reduce or eliminate damage to the FPA due to thermal coefficient mismatch between the detectors and ROIC.

FIGS. 1A and 1B illustrate the back-side process format for an FPA per the present invention. FIGS. 2A and 2B illustrate the front-side process format. As mentioned above, buffer layer 14 and common light-sensitive base layer 16 are fabricated on a substrate 30—shown in FIG. 2A. Mesas 24 are etched through base layer 16 and buffer layer 14 down to substrate 30, and then metallization 26 is provided at the bottom of the mesas to reconnect the detectors electrically and thereby provide a common ground between the detectors. In FIG. 2B, substrate 30 has been removed and AR coating 28 applied.

Backfill epoxy 22 is preferably soft and flexible, to enable the FPA to be easily bent. As noted above, the mesas are etched through base layer 16 and buffer layer 14 down to substrate 30. Thus, the mesa depth depends on the wavelength range provided by the FPA. For example, for an FPA sensitive to SWIR wavelengths, the material forming the detectors is typically about 6 microns thick, including the base, buffer, and any cap layer. So here, a mesa depth of 6 microns is necessary to get down to the substrate. Similarly, for an LWIR FPA, the detector material thickness is typically about 12 microns thick, requiring a mesa depth of 12 micron.

The curved FPA structure and method described herein can be employed for various FPA types. For example, the FPA could be grown and processed in HgCdTe, InGaAs, HyViSi, strained-layer superlattice (SLS), and other material systems. As the described FPA largely eliminates thermal coefficient mismatch between the detectors and ROIC, the need for a balanced composite structure (BCS) is eliminated. The FPA can be mounted on many different materials for packages.

One possible process sequence for fabricating a curved FPA as described herein is shown in FIGS. 3A-3R. In FIG. 3A, a buffer layer (not shown) and a light-sensitive base layer 40 are provided on a substrate 42, such as CdZnTe. Base layer 40 can comprise a grown material or a bulk material.

In FIG. 3B, the surface of base layer 40 has been processed, typically using photolithography, to form an array of detectors 44. Mesas 46 are etched through the base and buffer layers to substrate 42, such that the detectors are electrically and physically isolated from each other. Either wet etching or dry etching may be employed; dry etching gives higher aspect ratio side walls, but is harder to passivate and can create surface damage.

In FIG. 3C, metallization 48 is deposited at the bottom of mesas 46 to reconnect detectors 44 electrically and thereby provide a common ground between the detectors. Metallization 48 is preferably evaporated and soft; indium is preferred.

In FIG. 3D, metallization 50 is provided on respective detectors to enable their connection to a ROIC. Metallization 50 preferably comprises indium bumps, which are preferably evaporated onto respective detectors.

Figure 3H:
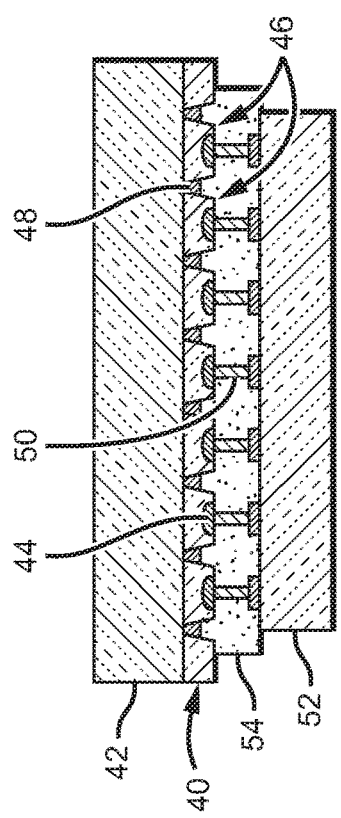

In FIGS. 3E and 3F, an ROIC 52 is hybridized to detectors 44 via metallization 50. Then, as shown in FIG. 3H, epoxy 54 is backfilled into the space between ROIC 52 and mesas 46 (note that the hybridized FPA of FIG. 3F is reproduced in FIG. 3G). When so arranged, when the FPA is curved, the resulting strain is across metallization 48 and backfill epoxy 54.

Figure 3I:
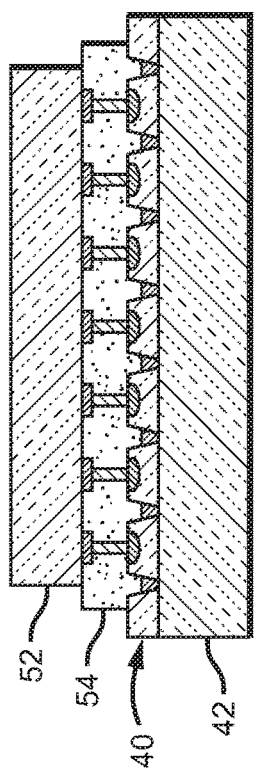
Figure 3J:
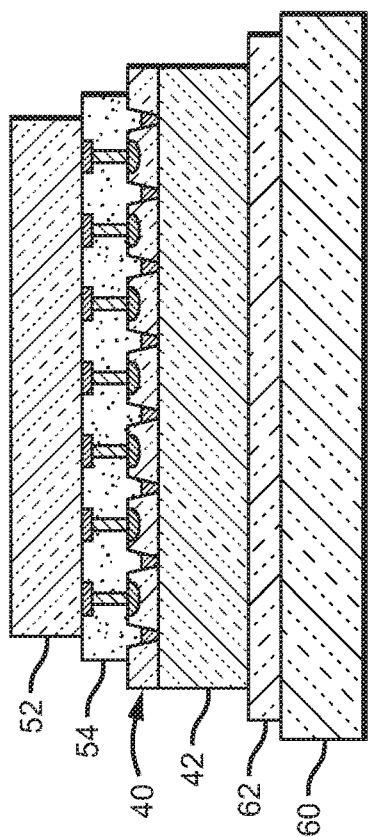

ROIC 52 is preferably thinned. This process is illustrated in FIGS. 3I-3L. In FIG. 3I, the FPA of FIG. 3H is reproduced, except that it is now shown flipped. In FIG. 3J (reproduced in FIG. 3K), substrate 42 is mounted to a carrier 60, preferably using a wax or photoresist (PR) layer 62. Then in FIG. 3L, ROIC 52 is thinned, preferably by polishing, down to a thickness of suitably 50 microns. Note that ROIC 52 could alternately be thinned independent of the rest of the FPA structure, prior to its being brought into contact with metallization bumps 50 (shown in FIG. 3F).

Figure 3L:
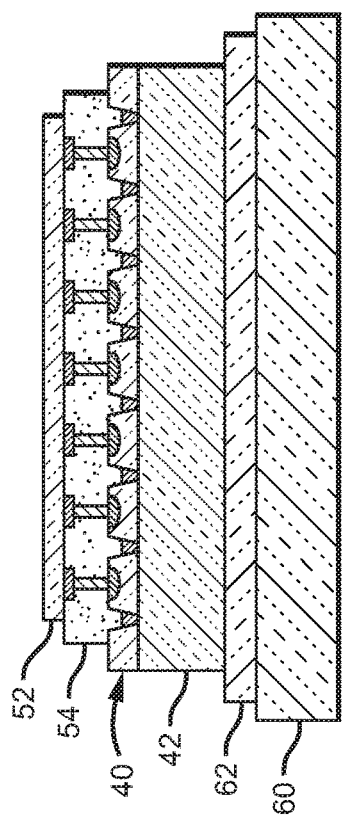
Figure 3N:
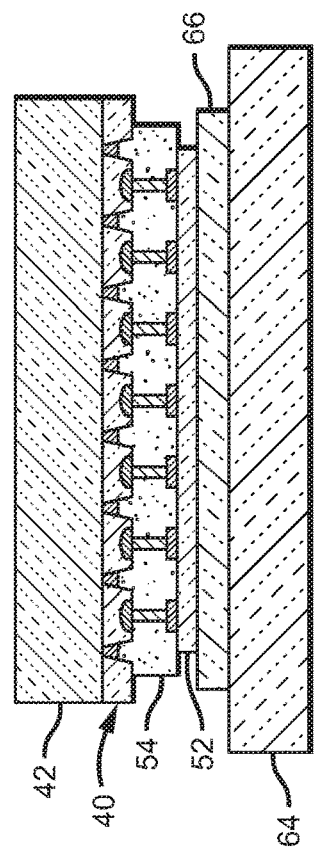
Figure 3K:
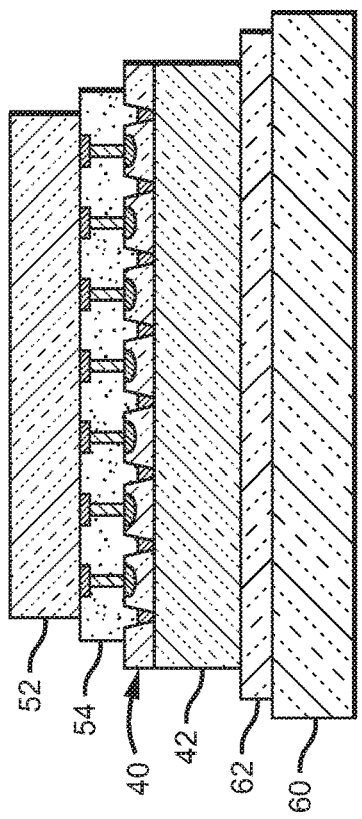
Figure 3M:
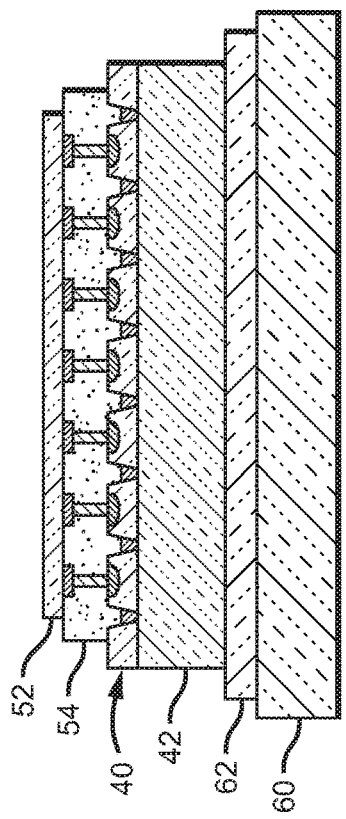

Substrate 42 is removed in FIGS. 3M-3P (note that FIG. 3M is a reproduction of FIG. 3L, and FIG. 3O is a reproduction of FIG. 3N). In FIG. 3N, substrate 42 has been demounted, the FPA structure has been flipped, and ROIC 52 is mounted to a carrier 64, preferably using a wax or PR layer 66. Then in FIG. 3P, substrate 42 has been removed, preferably by polishing.

Another optional step is to apply an AR coating to the FPA; this is illustrated in FIGS. 3Q and 3R. In FIG. 3Q, an AR coating 68 is applied to the exposed side of light-sensitive base layer 40, preferably by evaporation. Then in FIG. 3R, the process is completed by removing the flexible FPA from carrier 64.

Though not shown, an FPA as described herein could be made even more flexible by forming mesas on the backside of ROIC 52, such that the ROIC is reticulated.

The present curved FPA has many possible uses, including astronomy, military, and commercial applications. Such an FPA could enable lower cost and higher performance IR cameras, and could also be used in visible imaging.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of fabricating a curved focal plane array (FPA), comprising:
   forming an array of detectors on a substrate;
   etching mesas between said detectors such that said detectors are electrically and physically isolated from each other;
   depositing metallization at the bottom of said mesas to reconnect said detectors electrically and thereby provide a common ground between said detectors; and
   removing said substrate.

2. The method of claim 1, wherein said step of forming an array of detectors on a substrate comprises fabricating a common light-sensitive base layer and a common buffer layer.

3. The method of claim 2, wherein said step of etching mesas between said detectors comprises etching mesas through said common base and buffer layers.

4. The method of claim 2, further comprising evaporating an anti-reflective (AR) coating on said buffer layer, said step of evaporating said AR coating on said buffer layer performed after said step of removing said substrate.

5. The method of claim 2, wherein said base layer comprises a grown material or a bulk material.

6. The method of claim 1, further comprising evaporating indium bumps onto respective detectors for connection to a readout integrated circuit (ROIC).

7. The method of claim 1, further comprising coupling an ROIC to said detectors said step of removing said substrate performed after said ROIC is coupled to said detectors.

8. The method of claim 1, further comprising thinning said ROIC.

9. The method of claim 7, further comprising forming mesas on the backside of said ROIC such that said ROIC is reticulated.

10. The method of claim 1, wherein said mesas between said detectors are etched down to said substrate.

11. The method of claim 1, wherein said FPA is a HgCdTe FPA, an InGaAs FPA, a HyViSi FPA, or a SLS FPA.

12. The method of claim 1, further comprising employing a backfill epoxy such that when said FPA is curved, the resulting strain is across said metallization and said backfill epoxy.

13. The method of claim 1, wherein said step of depositing metallization at the bottom of said mesas comprises evaporating said metallization.

14. The method of claim 1, wherein said metallization comprises indium.

* * * * *